United States Patent
Nguyen et al.

(10) Patent No.: US 6,572,706 B1
(45) Date of Patent: Jun. 3, 2003

(54) INTEGRATED PRECURSOR DELIVERY SYSTEM

(75) Inventors: Tue Nguyen, Fremont, CA (US); Craig Alan Bercaw, Los Gatos, CA (US)

(73) Assignee: Simplus Systems Corporation, Fremont, CA (US)

( * ) Notice: Subject to any disclaimer, the term of this patent is extended or adjusted under 35 U.S.C. 154(b) by 196 days.

(21) Appl. No.: 09/596,517

(22) Filed: Jun. 19, 2000

(51) Int. Cl.[7] .............................................. C23C 16/00
(52) U.S. Cl. ..................... 118/724; 118/715; 118/726
(58) Field of Search ................. 118/715, 726, 118/724

(56) References Cited

U.S. PATENT DOCUMENTS

| | | | | |
|---|---|---|---|---|
| 4,872,947 A | * | 10/1989 | Wang ......................... | 156/345 |
| 5,248,380 A | * | 9/1993 | Tanaka ....................... | 156/626 |
| 5,698,037 A | * | 12/1997 | Stauffer ..................... | 118/726 |
| 6,036,783 A | * | 3/2000 | Fukunaga ................... | 118/724 |
| 6,096,133 A | * | 8/2000 | Yuuki ......................... | 118/712 |
| 6,106,625 A | * | 8/2000 | Koai ........................... | 118/715 |
| 6,176,930 B1 | * | 1/2001 | Koai ........................... | 118/715 |

* cited by examiner

*Primary Examiner*—Richard Bueker
(74) *Attorney, Agent, or Firm*—Tue Nguyen

(57) ABSTRACT

An integrated precursor delivery system which integrates a precursor delivery system with a processing chamber is provided for improving the precursor delivery lines to the processing chamber, and for keeping the delivery lines intact during servicing the processing chamber. The apparatus provides an integrated precursor delivery system mounted on the processing chamber lid with the chamber lid being removable for allowing manual access to the inside of the processing chamber. With the precursor delivery system is in the close vicinity of the processing chamber, the delivery lines are shortest possible, minimizing the chance of precursor contamination. With the delivery system and the chamber lid in one unit, the removal of the chamber lid will no longer require breaking the delivery lines, leading to better contamination control. The present invention is particular suitable for liquid precursors since liquid is much more difficult to evacuate than gas. The invention further provides a hybrid system of integrated precursor delivery system and remote precursor delivery system. For gaseous precursors, especially non-reactive precursor such as nitrogen, argon, helium, the cleaning of the delivery line is very simple. Therefore a hybrid system of integrated and remote precursor delivery systems offers the best solution, an integrated precursor delivery system for the difficult-to-clean precursors, and a remote precursor delivery system for the easy-to-clean precursors.

16 Claims, 9 Drawing Sheets

INTEGRATED PRECURSOR DELIVERY SYSTEM

FIELD OF THE INVENTION

The present invention relates generally to apparatus for processing of a semiconductor wafer, and more particularly to a processing chamber with integrated precursor delivery system.

BACKGROUND OF THE INVENTION

Conventional chemical vapor deposition (CVD) processes use precursors for the deposition of thin films on an IC substrate. Precursors can be classified as reactive precursors and non-reactive precursors. Reactive precursors are chemical species to undergo a reaction for the processing of the thin film. Non-reactive precursors are not reactive, and often used to dilute the reactive precursor or to carry the reactive precursors to the processing chamber. Such non-reactive precursor is called a carrier gas. Traditionally, precursors used in semiconductor processes are gaseous. To broaden the processes, more and more liquid and solid precursors have been used, especially in the area of metal-organic chemical vapor deposition (MOCVD). To perform this task, a liquid precursor is typically turned to vapor, and the vapor is then decomposed on the substrate. A solid precursor must often be dissolved into a solvent to form a liquid precursor. Then, the liquid precursor needs to be converted into vapor phase before introduction into the deposition zone.

The simplest form of liquid precursor delivery system is to draw the vapor from the liquid precursor. This technique works well with high volatile liquid with high vapor pressure. The liquid precursor can also be heat up to further increasing the vapor pressure. The liquid delivery line then needs to be heating up for preventing re-condensation. Another technique to increase the amount of vapor precursor of a liquid precursor is bubbling. A non-reactive precursor, often called a carrier gas, is bubbled through the liquid precursor. The carrier gas then carries the vapor precursor to the processing chamber.

However, to have high deposition rate with low vapor pressure precursors, a direct liquid injection system is required. Basic components of a direct liquid injection system is a liquid delivery line and a vaporizer. The liquid delivery line carries the liquid precursor from the liquid container to the vaporizer. The vaporizer converts the liquid precursor into vapor form before delivering on the wafer substrate. A carrier gas is normally used in the vaporizer to carry the precursor vapor to the substrate. In some applications, a reactive precursor could take place of the carrier gas, performing the carrying function together with a chemical reaction.

FIG. 1 shows a prior art gaseous precursor delivery system. The precursor 13 is stored in gaseous form in the container 12, often under high pressure. The delivery line 11 is used to take the precursor out of the container to the processing chamber. A heater means 14 is used to heat the container 12 to increase the pressure of the precursor in the container.

FIG. 2 shows a prior art liquid precursor delivery system. The liquid precursor 23 is stored in the container 22 and having a certain vapor precursor 26 co-existing in the container. The heater means 24 is used to heat the container 22 to increase the precursor vapor pressure. The precursor delivery line 21 is used to take the precursor vapor out of the container to the processing chamber. A second heater means 25 is used to heat the delivery line to prevent condensation.

FIG. 3 shows a prior art solid precursor delivery system. The solid precursor 33 is stored in the container 32 and having a certain vapor precursor 36 co-existing in the container. The heater means 34 is used to heat the container 32 to increase the precursor vapor pressure. The precursor delivery line 31 is used to take the precursor vapor out of the container to the processing chamber. A second heater means 35 is used to heat the delivery line to prevent condensation.

FIG. 4 shows another prior art liquid precursor delivery system. The liquid precursor 43 is stored in the container 42 and having a certain vapor precursor 46 co-existing in the container. The heater means 44 is used to heat the container 42 to increase the precursor vapor pressure. A carrier gas 47 is used to bubble through the liquid precursor to increase the precursor vapor through the delivery line 41. The precursor delivery line 41 is used to take the precursor vapor out of the container to the processing chamber. A second heater means 45 is used to heat the delivery line to prevent condensation.

FIG. 5 shows another prior art liquid precursor delivery system. This system injects the liquid precursor 53 through the delivery line 51, and then converts the liquid to vapor form in the vaporizer 58. The liquid precursor 53 is stored in the container 52 and having a certain vapor precursor 56 co-existing in the container. A carrier gas 57 is used to push the liquid precursor to the delivery line 51. The precursor delivery line 51 is used to take the precursor liquid out of the container to the vaporizer 58. A heater means 59 is used to heat the vaporizer 58 to convert the liquid precursor to vapor form.

In these drawings, all controlled valves have been omitted for clarity. Such valves are used to control the start, stop and even the flow rate of the precursor.

The precursor delivery system delivers the precursor vapor to a processing chamber, typically to the chamber lid, where the precursor vapor will react at a wafer surface. The precursor by-products are then pumped out to the exhaust. The precursor delivery line often has a showerhead to distribute the precursor vapor evenly on the wafer surface. The precursor delivery system are mounted in a remote location from the processing chamber, and having an enclosure with an exhaust fan to prevent the accidental leakage of the precursor to the environment. Typical processing chamber has a removable chamber lid to allow manual access to the inside of the processing chamber such as repair or servicing the inside of the processing chamber. Therefore the remote precursor delivery system will need to have the delivery line broken to remove the chamber lid.

FIG. 6 shows a prior art remote precursor delivery system. The precursor 143 is stored in the precursor container 142, and will travels through the precursor delivery line 141 to the chamber lid 110. The chamber lid 110 has a inlet port to the inside of the processing chamber, in this case a showerhead 120. The chamber lid 110 is removable from the chamber body 112 at the connection 114. Since the delivery line 141 is solid, to remove the chamber lid 110 means breaking the delivery line at the connection 130. Before breaking the connection 130, the delivery line needs to be clean to avoid contaminating the environment. After re-connect the connection 130, the delivery line needs to be clean again to avoid contaminating the precursor. These cleaning procedure is time consuming and difficult, especially for liquid precursor. It is best to replace the liquid delivery line, or at the very least, clean in solvent and bake out at high temperature to remove moisture, every time the connection 130 is broken.

FIG. 7 shows another prior art remote precursor delivery system. The chamber lid 110 is removable from the chamber body 112 at the connection 114. Connection 114 also includes a mating o-ring connection 160 between the chamber lid 110 and the chamber body 112 for the delivery line. This way when the chamber lid is removed, the delivery line is automatically broken. As with FIG. 6 configuration, this configuration also requires cleaning of the delivery line before and after breaking the connection 160.

FIG. 8 shows another prior art remote precursor delivery system. The delivery line 141 includes a loop section 140 to allow limited movement of the chamber lid 110 without breaking the delivery line 141. Similarly, the delivery line 141 of FIG. 9 configuration includes a flexible section 150 to allow limited movement of the chamber lid 110 without breaking the delivery line 141. The advantage of these two configurations is that the delivery line 141 remains intact during the removal of the chamber lid 110. The disadvantages are the extra length of the delivery line and its long term reliability. In fact, the movable delivery line is not popular in many equipment vendors.

It would be advantageous if a precursor delivery line remains intact during the removal of the chamber lid.

It would be advantageous if a precursor delivery line does not move during the removal of the chamber lid.

SUMMARY OF THE INVENTION

Accordingly, an integrated delivery processing chamber apparatus is provided to maintaining the delivery line intact during the removal of the chamber lid. In the present invention, the precursor delivery system is mounted to the chamber lid, therefore the delivery line and the chamber lid move together as one unit. An additional benefit of the present invention is the short delivery line since the precursor delivery system and the processing chamber is very close to each other.

The present invention integrated precursor delivery system apparatus which integrates a precursor delivery system with a processing chamber comprises:
- a hollow processing chamber comprising a removable chamber lid for allowing manual access to the inside of the processing chamber;
- an integrated precursor delivery system mounted to the chamber lid and operatively connected to the chamber lid, the precursor delivery system comprising:
  - a precursor container for containing the precursor;
  - a precursor delivery line;
  - whereby the precursor delivery line delivers the precursor from the precursor container to the processing chamber with the precursor delivery line remains intact during the removal of the chamber lid.

The output of the precursor delivery system is connected to the chamber lid to provide the precursor vapor to the processing chamber. In some aspects of the invention, to improve the uniformity of the precursor distribution, the chamber lid comprises a showerhead connected to the output of the precursor delivery system. The precursor delivery system further comprises various valves to allow the control of the precursor flow.

In some aspects of the invention, the apparatus further comprises a system heater means to heat the precursor delivery system or to heat the precursor delivery line.

In some aspects of the invention, the precursor is in solid form, and the precursor delivery line carries only the precursor vapor from the precursor container to the processing chamber. In some aspects of the invention, the precursor is in gaseous form, and the precursor delivery line carries the gaseous precursor from the precursor container to the processing chamber. In some aspects of the invention, the precursor is in liquid form, and the precursor delivery line carries only the precursor vapor from the precursor container to the processing chamber. Sometimes the precursor delivery system further comprises a carrier gas system to help carrying the precursor vapor from the precursor container to the processing chamber.

In some aspects of the invention, the precursor is in liquid form, and the precursor delivery line carries the precursor liquid from the precursor container to the processing chamber. The precursor delivery system further comprises a vaporizer to convert the liquid precursor to vapor form before reaching to the processing chamber. The precursor delivery system further comprises a precursor metering device to control the precursor flow rate from the precursor container to the processing chamber. The precursor metering device could be a liquid pump, a liquid flow controller to measure the liquid flow, or a mass flow controller to measure the gas flow.

In some aspects of the invention, the precursor delivery system further comprises a precursor refilling system for refilling the precursor container. The precursor refilling system could comprise flexible refilling lines to accommodate the movement of the chamber lid. Or the precursor refilling system line will need to be broken to remove the chamber lid. Since the refilling line will not be used as much as the delivery line, the cleaning of the refilling line before and after the breakage will not be frequent.

In some aspects of the invention, the apparatus further comprises a plurality of precursor delivery systems. These multiple precursor delivery systems could share the same output manifold to the chamber lid. Various processes requires multiple precursors and multiple separate precursor delivery systems.

In some aspects of the invention, the apparatus further comprises a remote precursor delivery system. In some aspects of the invention, the remote precursor delivery system provides gaseous precursor. For liquid injection, or bubbling system, a carrier gas is needed. Since the carrier gas is often inert gas, this line does not need the extensive cleaning before and after the line breakage. The remote precursor delivery line could comprise flexible lines or mating o-ring between the chamber lid and the chamber body to accommodate the movement of the chamber lid.

In some aspects of the invention, the precursor delivery system further comprises an enclosure for capturing potential precursor leakage. The precursors could be toxic, therefore an enclosure with a exhaust fan helps in the unlikely scenario of precursor leakage.

DETAIL DESCRIPTION OF THE PREFERRED EMBODIMENT

Figure 1:
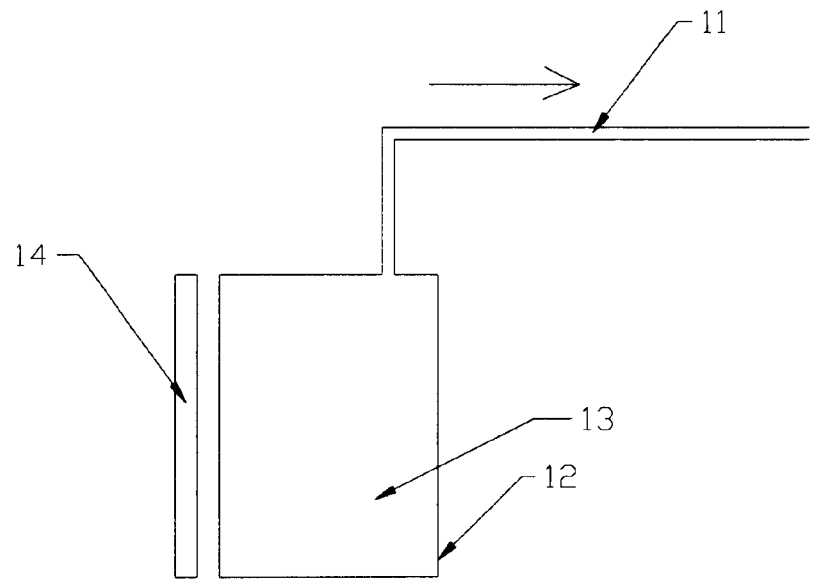
FIG. 1 shows a prior art compressed gaseous precursor delivery system.
Figure 2:
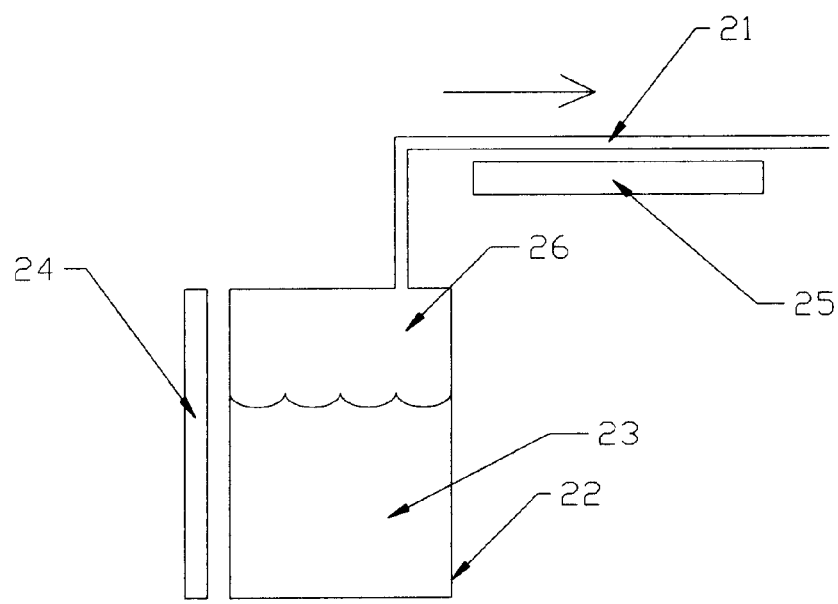
FIG. 2 shows a prior art liquid precursor delivery system with vapor delivery line.
Figure 3:
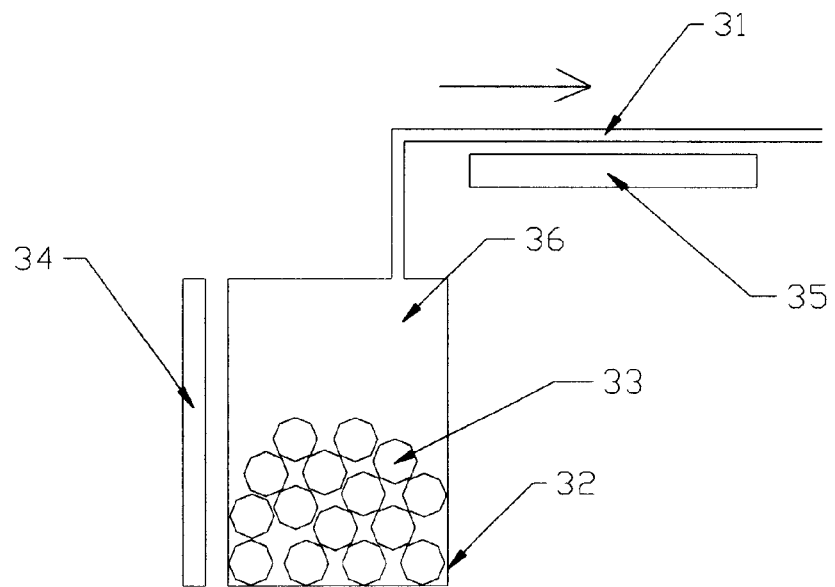
FIG. 3 shows a prior art solid precursor delivery system with vapor delivery line.
Figure 4:
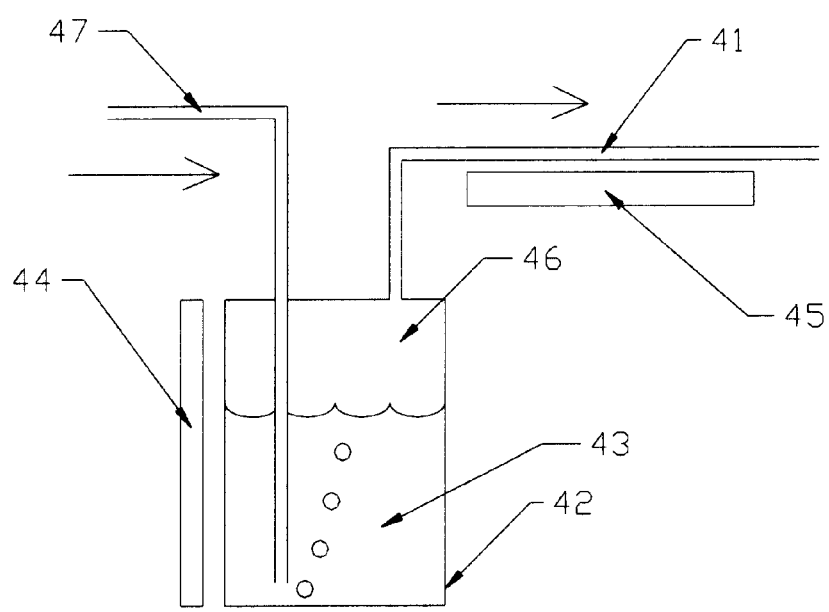
FIG. 4 shows a prior art liquid precursor delivery system with vapor delivery line and bubbling system.
Figure 5:
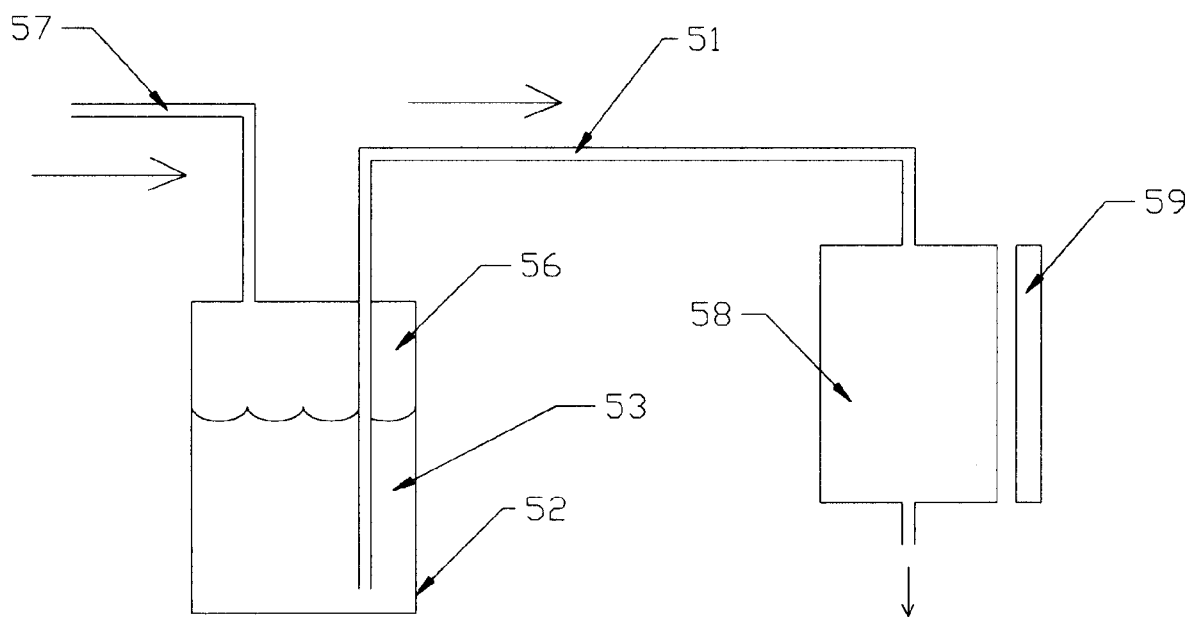
FIG. 5 shows a prior art liquid precursor delivery system with liquid delivery line and vaporizer.
Figure 6:
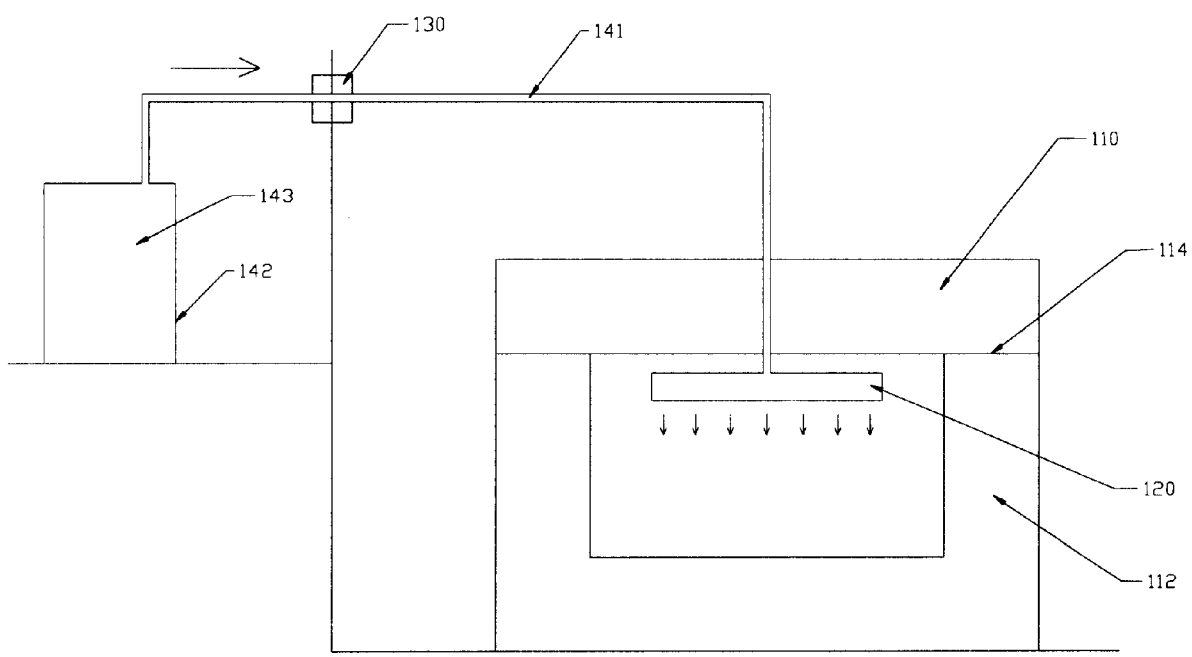
FIG. 6 shows a prior art remote precursor delivery system with breakable precursor delivery line.
Figure 7:
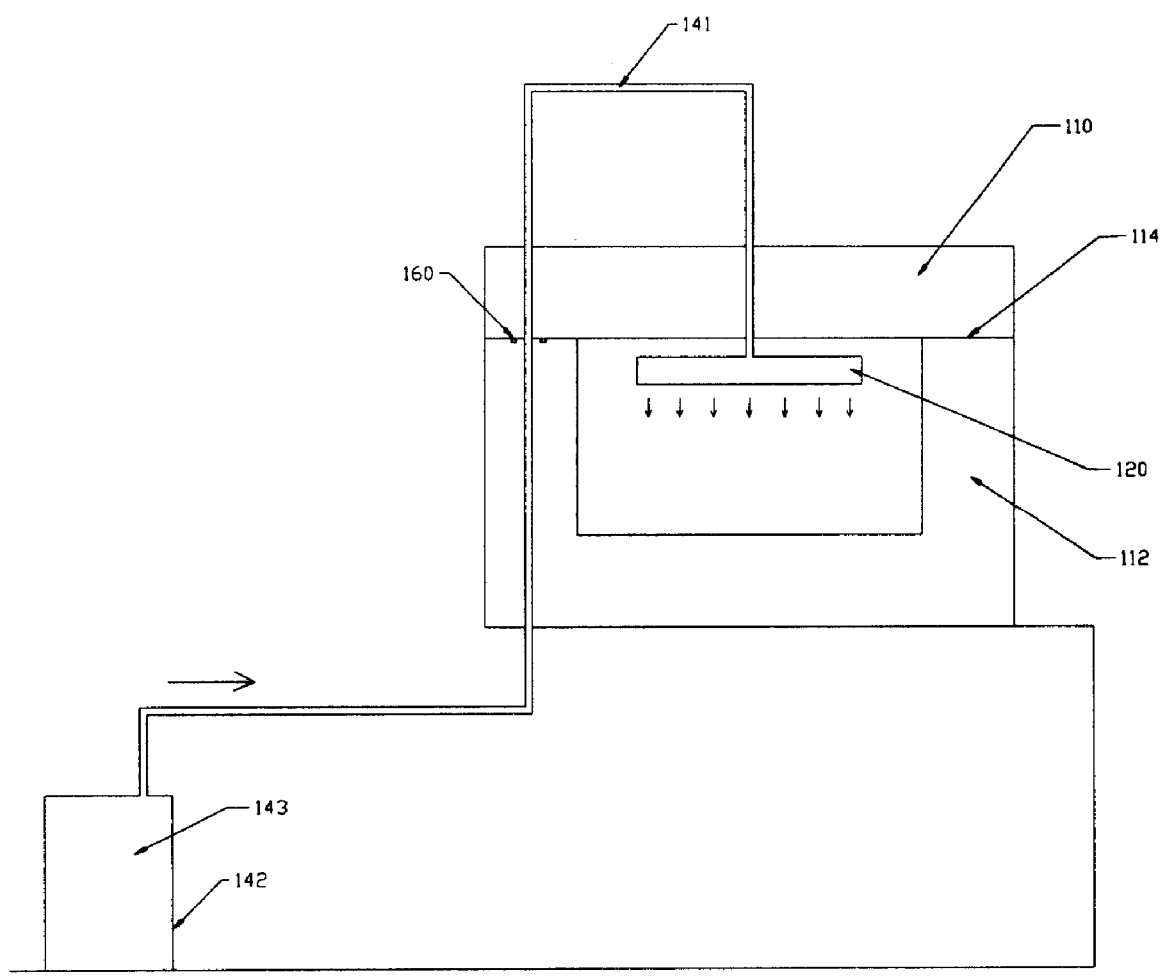
FIG. 7 shows another prior art remote precursor delivery system with breakable precursor delivery line.
Figure 8:
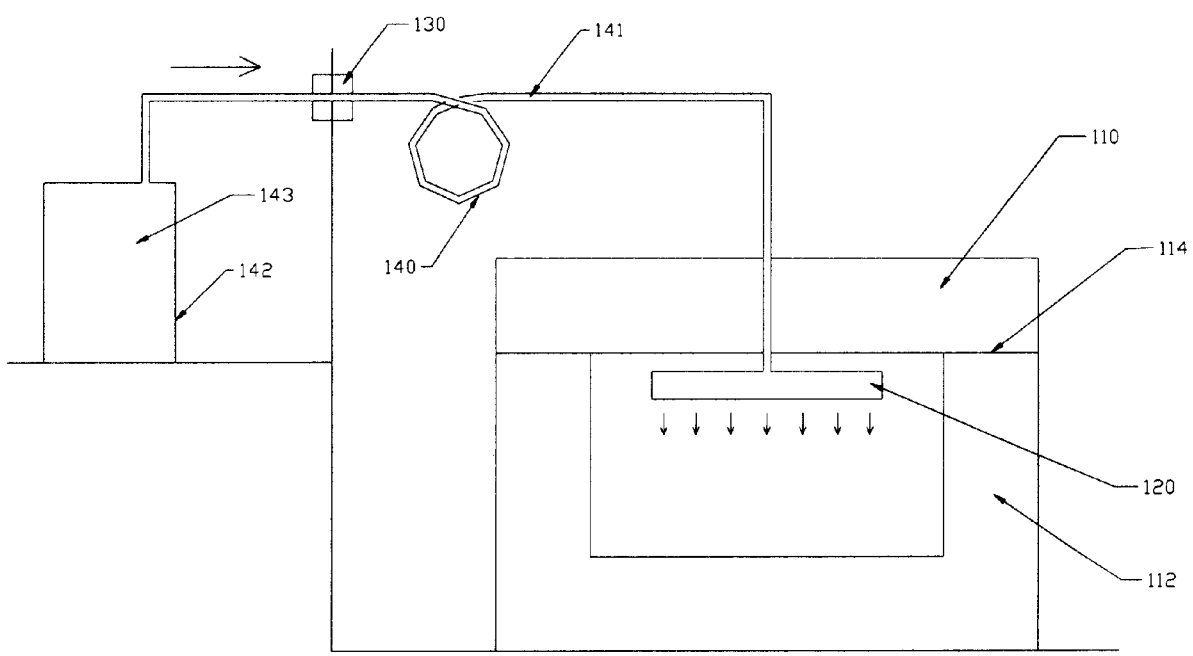
FIG. 8 shows a prior art remote precursor delivery system with movable precursor delivery line.
Figure 9:
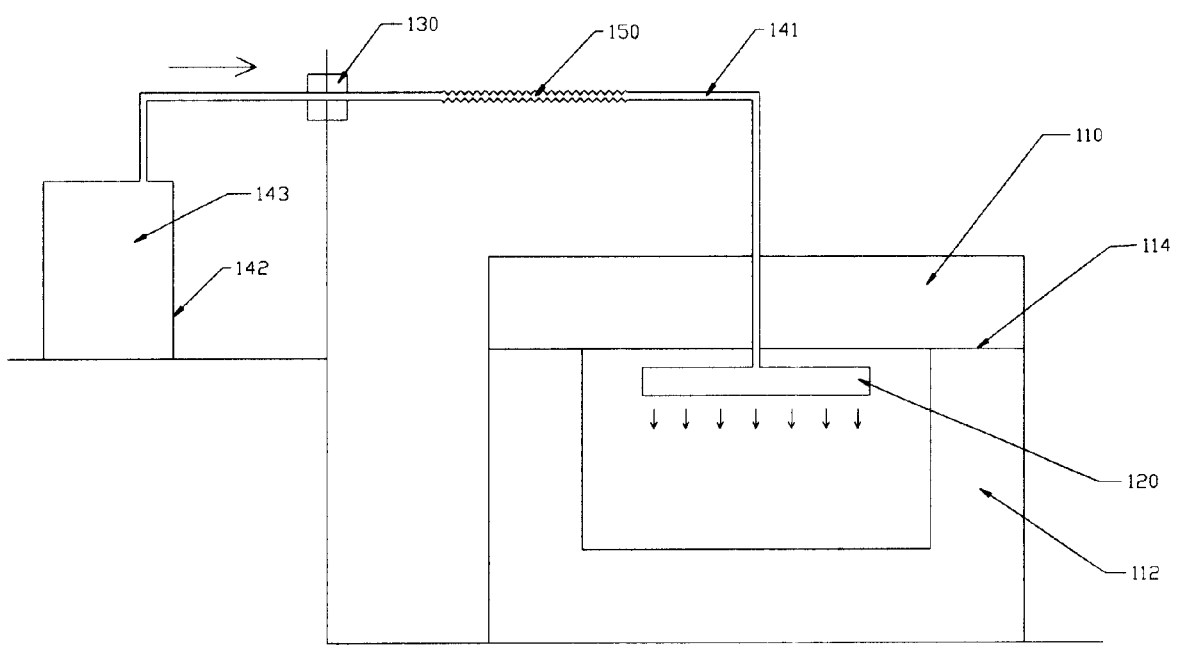
FIG. 9 shows another prior art remote precursor delivery system with movable. precursor delivery line.
Figure 10:
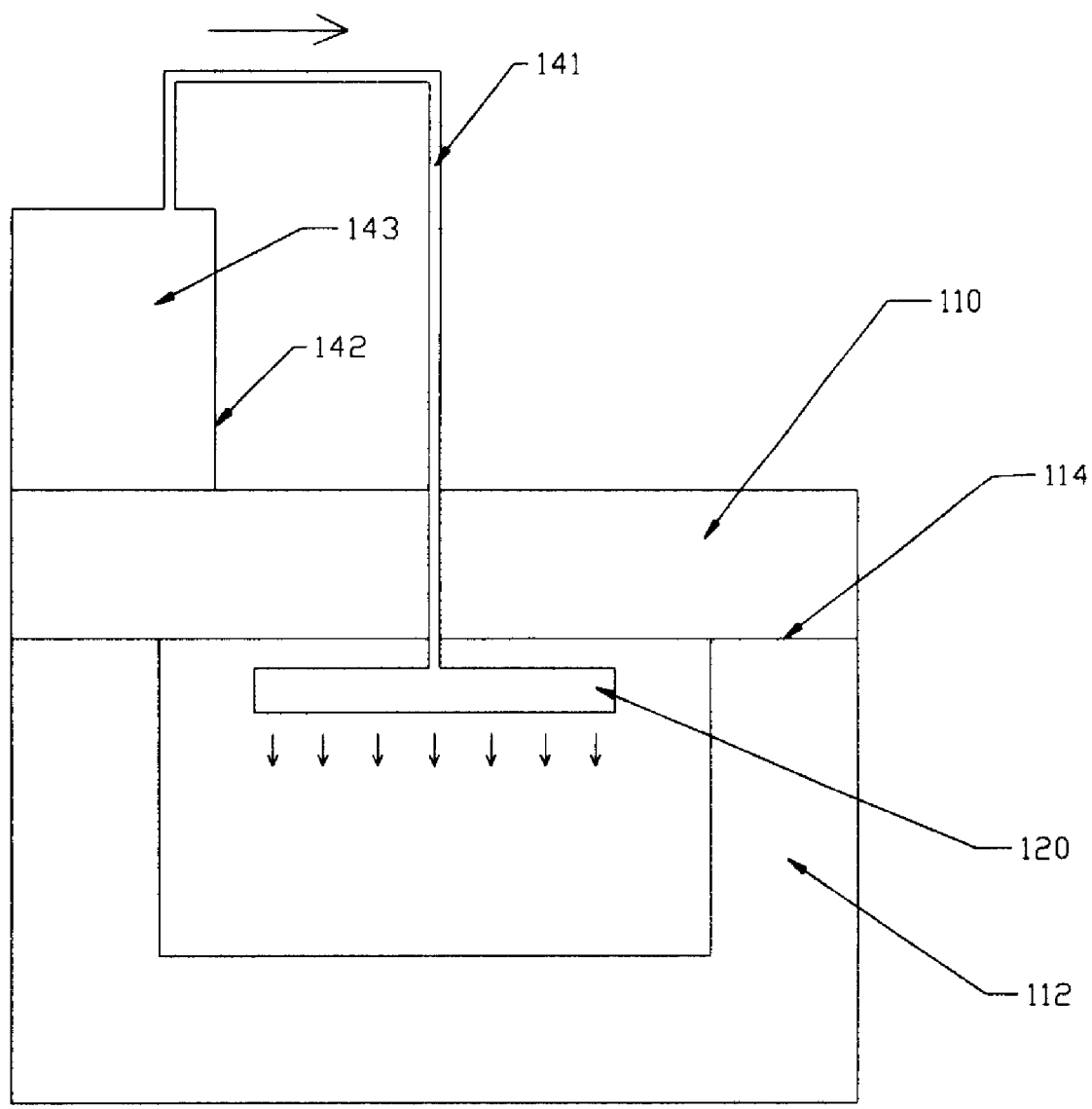
FIG. 10 shows the present invention integrated precursor delivery system.

FIG. 10 shows the present invention integrated precursor delivery system. The present invention integrates a precursor delivery system with a processing chamber for the ease of servicing the processing chamber. Added benefits are shorter delivery line, and compact and modular system. The invention provides a precursor delivery system 141, 142, 143 mounted on a removable chamber lid 110. The precursor delivery system comprises a precursor container 142 to contain the precursor 143, and a precursor delivery line 141 to deliver the precursor 143 from the precursor container 142 to the processing chamber. The processing chamber comprises a chamber body 112 and a removable chamber lid 110. The chamber lid 110 can be removed from the processing chamber at the connection 114 for servicing the inside of the processing chamber. The precursor delivery line 141 is operatively connected to the chamber lid 110 to delivering the precursor to the inside of the processing chamber. An optional showerhead 120 is connected to the precursor delivery line 141 for better precursor distribution. With the precursor delivery system mounted to the chamber lid, the removal of the chamber lid will also move the precursor delivery system, thus the precursor delivery line remains intact.

Figure 11:
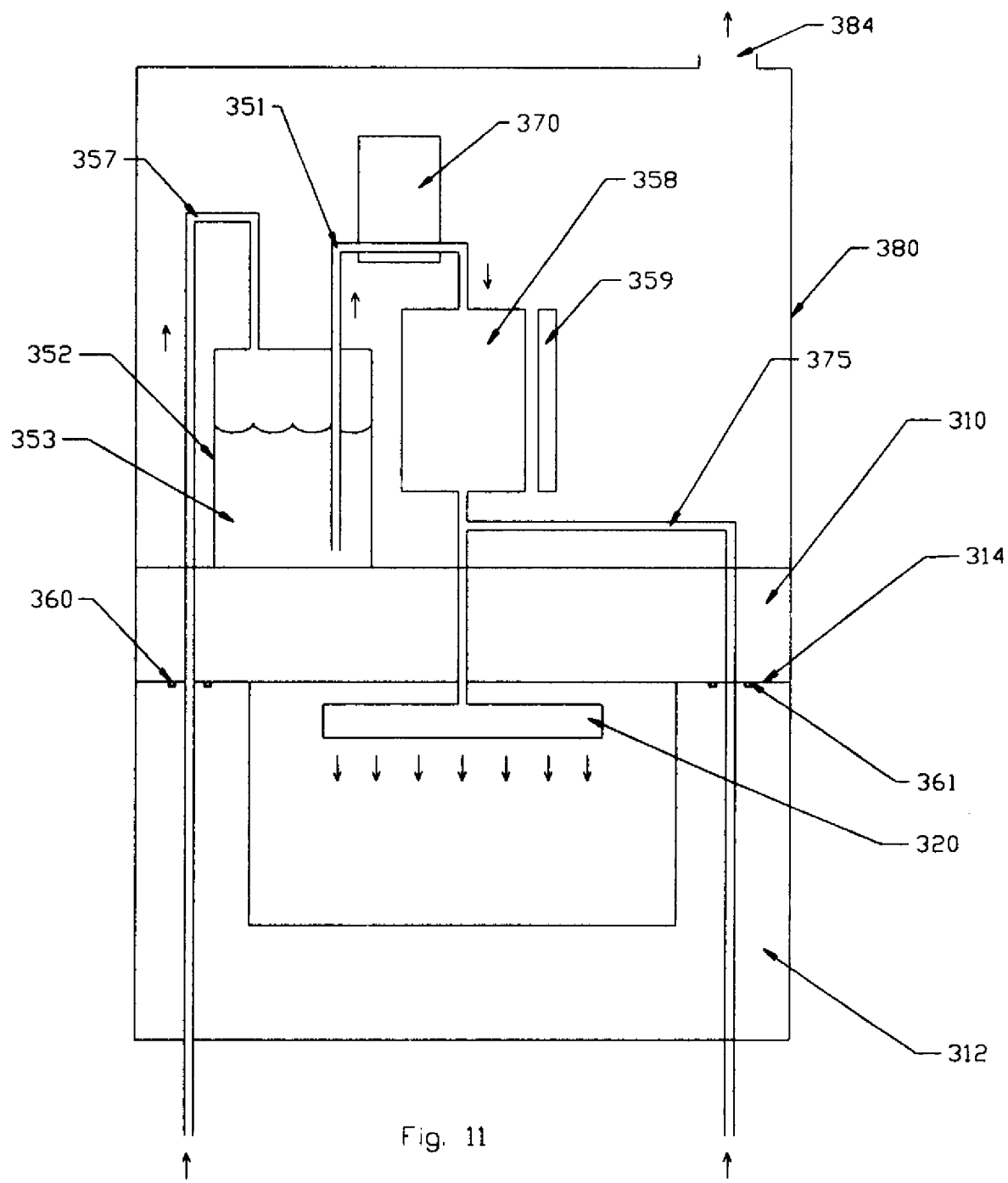
FIG. 11 shows another aspect of the present invention integrated precursor delivery system.

FIG. 11 shows another aspect of the present invention integrated precursor delivery system. The system is a hybrid of integrated precursor delivery system and remote precursor delivery system. The cleaning of liquid delivery line to ensure no contamination is very difficult and time consuming, thus an integrated precursor delivery system is well suited for liquid precursors. The major disadvantage of the integrated precursor delivery system is that there is not enough room at the chamber lid to accommodate all the delivery components. However, for gaseous precursors, especially non-reactive precursor such as nitrogen, argon, helium, the cleaning of the delivery line is very simple. A few pump/purge cycles of the delivery line should be adequate. Therefore a hybrid system of integrated and remote precursor delivery systems offers the best solution, an integrated precursor delivery system for the difficult-to-clean precursors, and a remote precursor delivery system for the easy-to-clean precursors. The integrated liquid precursor delivery system is mounted to the chamber lid 310 and the remote gaseous precursor delivery systems provide gaseous precursor 357 and 375 to the chamber lid 310 through the mated o-ring connections 360 and 361 respectively. The gaseous precursor 357 is a pushing gas, used to push the liquid precursor 353 in the liquid precursor container 352. The liquid precursor travels through the liquid precursor delivery line 351 to a metering device 370 to control the precursor flow rate. The liquid precursor is then vaporized in the vaporizer 358. The vaporizer 358 is heated to a vaporizer temperature by a heater 359. An optional remote precursor 375 is provides to the output of the vaporizer 358 and to the processing chamber. The precursor delivery system is enclosed in an enclosure 380 having an exhaust port 384 to protect the environment from accidental release of precursors.

Although a preferred embodiment of practicing the method of the invention has been disclosed, it will be appreciated that further modifications and variations thereto may be made while keeping within the scope of the invention as defined in the appended claims.

What is claimed is:

1. An integrated precursor delivery system apparatus which integrates a precursor delivery system with a processing chamber, the apparatus comprising:

a hollow processing chamber comprising a removable chamber lid for allowing manual access to the inside of the processing chamber;

a liquid precursor container mounted on the chamber lid for storing the precursor in bulk liquid form;

a vaporizer; and a precursor delivery line communicated with the liquid precursor container and the vaporizer;

whereby the precursor delivery line delivers the precursor from the liquid precursor container to the vaporizer with the precursor delivery line remaining intact during the removal of the chamber lid.

2. An apparatus as in claim 1 further comprising a precursor heater to heat the precursor container.

3. An apparatus as in claim 1 in which the precursor delivery system further comprises a delivery line heater to heat the precursor delivery line.

4. An apparatus as in claim 1 further comprising a remote precursor delivery system.

5. An apparatus as in claim 4 which the remote precursor delivery system provides gaseous precursor.

6. An apparatus as in claim 4 in which the remote precursor delivery system comprises flexible lines to accommodate the movement of the chamber lid.

7. An apparatus as in claim 4 in which the remote precursor delivery system comprises an o-ring seal between the chamber lid and the rest of the hollow processing chamber to accommodate the movement of the chamber lid.

8. An apparatus as in claim 1 in which one end of the precursor delivery line is communicated with the liquid precursor in the liquid precursor container, and the precursor delivery line carries the precursor in liquid form from the liquid precursor container for a predetermined distance.

9. An apparatus as in claim 1 in which the precursor delivery system further comprises an enclosure for capturing potential precursor leakage.

10. An apparatus as in claim 1 in which the precursor delivery system further comprises a precursor metering device to control the precursor flow rate from the liquid precursor container to the vaporizer.

11. An apparatus as in claim 10 in which the precursor metering device is a liquid pump.

12. An apparatus as in claim 10 in which the precursor metering device is a liquid flow controller.

13. An apparatus as in claim 10 in which the precursor metering device is a mass flow controller.

14. An apparatus as in claim 1 further comprising a precursor refilling system for refilling the liquid precursor container.

15. An apparatus as in claim 14 in which the precursor refilling system comprising flexible refilling lines to accommodate the movement of the chamber lid.

16. An apparatus as in claim 1 further comprising a plurality of integrated precursor delivery systems.

* * * * *